(12) United States Patent
Quach et al.

(10) Patent No.: US 8,123,365 B2
(45) Date of Patent: Feb. 28, 2012

(54) ONE-WAY DISPLAY USING COLOR FILTER

(75) Inventors: Cang V. Quach, Milpitas, CA (US); Donald L. Alvarez, Woodinville, WA (US)

(73) Assignee: Emiscape, Inc., San Francisco, CA (US)

( * ) Notice: Subject to any disclaimer, the term of this patent is extended or adjusted under 35 U.S.C. 154(b) by 956 days.

(21) Appl. No.: 11/782,597

(22) Filed: Jul. 24, 2007

(65) Prior Publication Data
US 2009/0027630 A1  Jan. 29, 2009

(51) Int. Cl.
G03B 21/14 (2006.01)
(52) U.S. Cl. ............... 353/84; 353/22; 359/636
(58) Field of Classification Search .......... 353/13, 353/22, 84, 12; 359/629, 636
See application file for complete search history.

(56) References Cited

U.S. PATENT DOCUMENTS

| 5,986,401 A | 11/1999 | Thompson et al. |
| 6,428,169 B1 | 8/2002 | Dieter et al. |
| 6,715,887 B2 * | 4/2004 | Chang ............................ 353/84 |
| 6,870,670 B2 | 3/2005 | Gehring et al. |
| 6,872,435 B2 * | 3/2005 | Bull et al. ................... 428/40.1 |
| 2005/0231692 A1 | 10/2005 | Sun et al. |
| 2006/0232749 A1 | 10/2006 | Quach |

OTHER PUBLICATIONS

PCT Written Opinion of the International Searching Authority and International Search Report, 9 pages.

* cited by examiner

*Primary Examiner* — Kevin Pyo
(74) *Attorney, Agent, or Firm* — Patent Law Group LLP; David C. Hsia

(57) ABSTRACT

A one-way display system includes a transparent screen and a transparent color filter. An image is emitted by the screen or projected onto the screen. The image is formed from a combination of colored lights. Instead of spanning all the wavelengths of each color, each light only spans a narrow band of the color. The color filter removes the narrow band so the image is only visible from one side of the screen. As the color filter removes only the narrow band, one can still look out and see objects on the other side of the screen minus the colors of the narrow band.

26 Claims, 3 Drawing Sheets

ONE-WAY DISPLAY USING COLOR FILTER

CROSS REFERENCE TO RELATED APPLICATION

This application is related to (1) U.S. patent application Ser. No. 11/109,543, entitled "Polarized Projection Display," filed on Apr. 18, 2005, (2) U.S. patent application Ser. No. 11/367,687, entitled "One-Way Transparent Display Systems," filed on Mar. 3, 2006, and (3) U.S. patent application Ser. No. 11/626,247, entitled "Projection Display with Holographic Screen," filed on Jan. 23, 2007, which are incorporated herein by reference.

FIELD OF INVENTION

This invention relates to displays, and specifically to transparent displays with an image that is visible from one side of the display but not the other.

DESCRIPTION OF RELATED ART

Generally speaking, advertising is the paid promotion of goods, services, companies and ideas by an identified sponsor. Advertisements on the sides of buildings were common in the early-20th century U.S. One modern example is the NASDAQ sign at the NASDAQ Market Site at 4 Times Square on 43rd Street. Unveiled in January 2000, it cost $37 million to build. The sign is 120 feet high and is the largest LED display in the world. NASDAQ pays over $2 million a year to lease the space for this sign. This is considered a good deal in advertising as a result of the number of "impressions" the sign makes far exceeds those generated by other ad forms. However, advertisements on the side of a building cover up what otherwise would be space for windows in the building.

Thus, what is needed is an apparatus that would provide advertisements on the side of buildings while still allowing for windows in the advertisement space.

SUMMARY

In one embodiment of the invention, a one-way display system includes a transparent screen and a transparent color filter. An image is emitted by the screen or projected onto the screen. The image is formed from a combination of colored lights. Instead of spanning all the wavelengths of each color, each light only spans a narrow band of the color. The color filter removes the narrow band (e.g., by reflection, absorption, or other filtering methods) so the image is only visible from one side of the screen. As the color filter only removes the narrow band, one can still look out and see objects on the other side of the screen minus the colors of the narrow band.

BRIEF DESCRIPTION OF THE DRAWINGS

Use of the same reference numbers in different figures indicates similar or identical elements.

DETAILED DESCRIPTION

Figure 1:
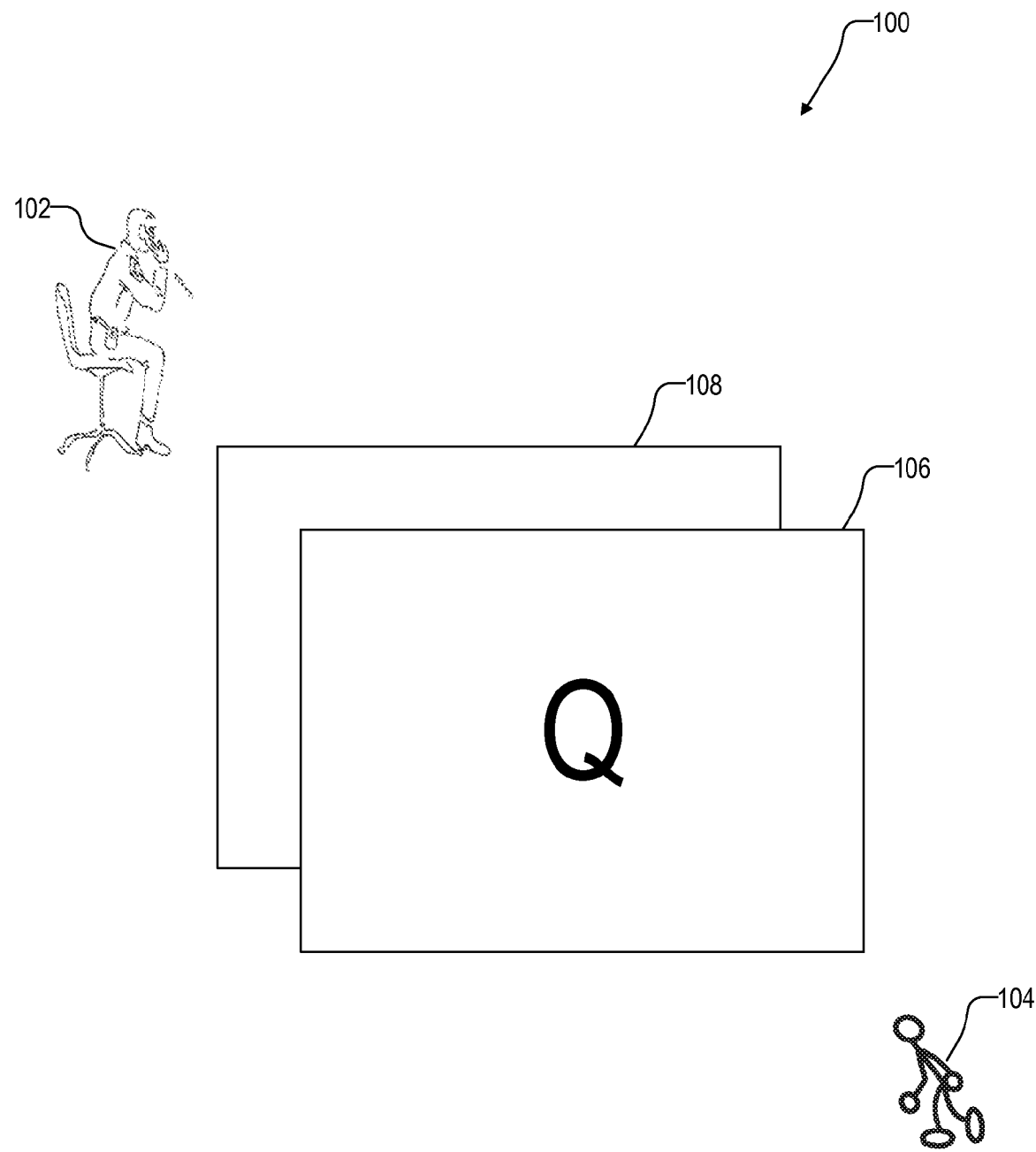
FIG. 1 illustrates a one-way display system in one embodiment of the invention.

FIG. 1 illustrates a one-way display system 100 in one embodiment of the invention. System 100 may be part of a window, a windshield, a glass panel, and other similar structures. System 100 allows a person 102 on one side of the system to see out without viewing an image "Q" displayed for a person 104 on the other side of the system.

System 100 includes a transparent screen 106 and a transparent color filter 108 parallel to screen 106. Screen 106 emits light in one or more narrow bands of colors to form image Q that is visible to person 104. Color filter 108 removes the narrow bands so person 102 does not see image Q. However, person 102 can still see the objects on the other side of screen 106 minus the narrow bands.

Screen 106 may be implemented with any transparent display. In one embodiment, screen 106 is a single panel of transparent light emitting diodes (LEDs) that emit a single narrow band of color. Each LED makes up one pixel of the screen.

In another embodiment, screen 106 is a single panel of transparent LEDs that emit multiple narrow bands of colors. For example, screen 106 includes red, green, and blue LEDs. The color LEDs are interspersed and grouped into pixels of the screen. Each pixel consists of three neighboring red, green, and blue LEDs. The pixels each provide a desired color by the combination of the red, green, and blue lights from its LEDs.

In another embodiment, screen 106 includes more than one panel of transparent LEDs. For example, screen 106 includes a panel of red LEDs, a panel of green LEDs, and a panel of blue LEDs that emit their respective narrow bands of colors. The LEDs are grouped into pixels of the screen. Each pixel consists of a red LED, a green LED, and a blue LED at the same position from the three panels. The pixels each provide a desired color by the combination of the red, green, and blue lights from its LEDs.

In one embodiment, the transparent LEDs are TOLED® from Universal Display Corporation of Ewing, N.J. Alternatively, the transparent LEDs may be any transparent light emissive layers capable of emitting narrow bands of colors.

Color filter 108 substantially removes the narrow band or bands emitted by screen 106 to prevent person 102 from seeing image Q on the backside of screen 106. A narrow band is substantially removed when color filter 108 blocks (e.g., by reflecting, absorbing, or other similar methods) 50% or more of the energy in the band. Preferably, each narrow band is contained within a filtered band of color filter 108. After color filter 108 removes the narrow bands emitted by screen 106, person 102 still sees objects on the other side of the screen 106 minus the colors of the narrow bands. Furthermore, person 104 sees image Q on the front side of screen 106. In one embodiment, screen 106 and color filter 108 are separate elements and color filter 108 is mounted on screen 106. Alternatively, screen 106 and color filter 108 are manufactured as an integral element.

Color filter 108 removes the narrow band or bands by reflection, absorption, or other filtering methods. In one embodiment, color filter 108 is made from several color notch filters stacked on top of each other to filter multiple narrow bands. Alternatively, color filter 108 is an integrated color notch filter that filters multiple narrow bands.

A human observer typically perceives the color red to span the wavelengths of 625-740 nm, the color green to span the wavelengths of 500-565 nm, and the color blue to span the wavelengths of 450-485 nm. In one embodiment, the narrow bands that are emitted by screen 106 are equal to or narrower than these ranges. For example, the narrow bands can be made as small as possible with current transparent LED and notch filter technologies.

Figure 2:
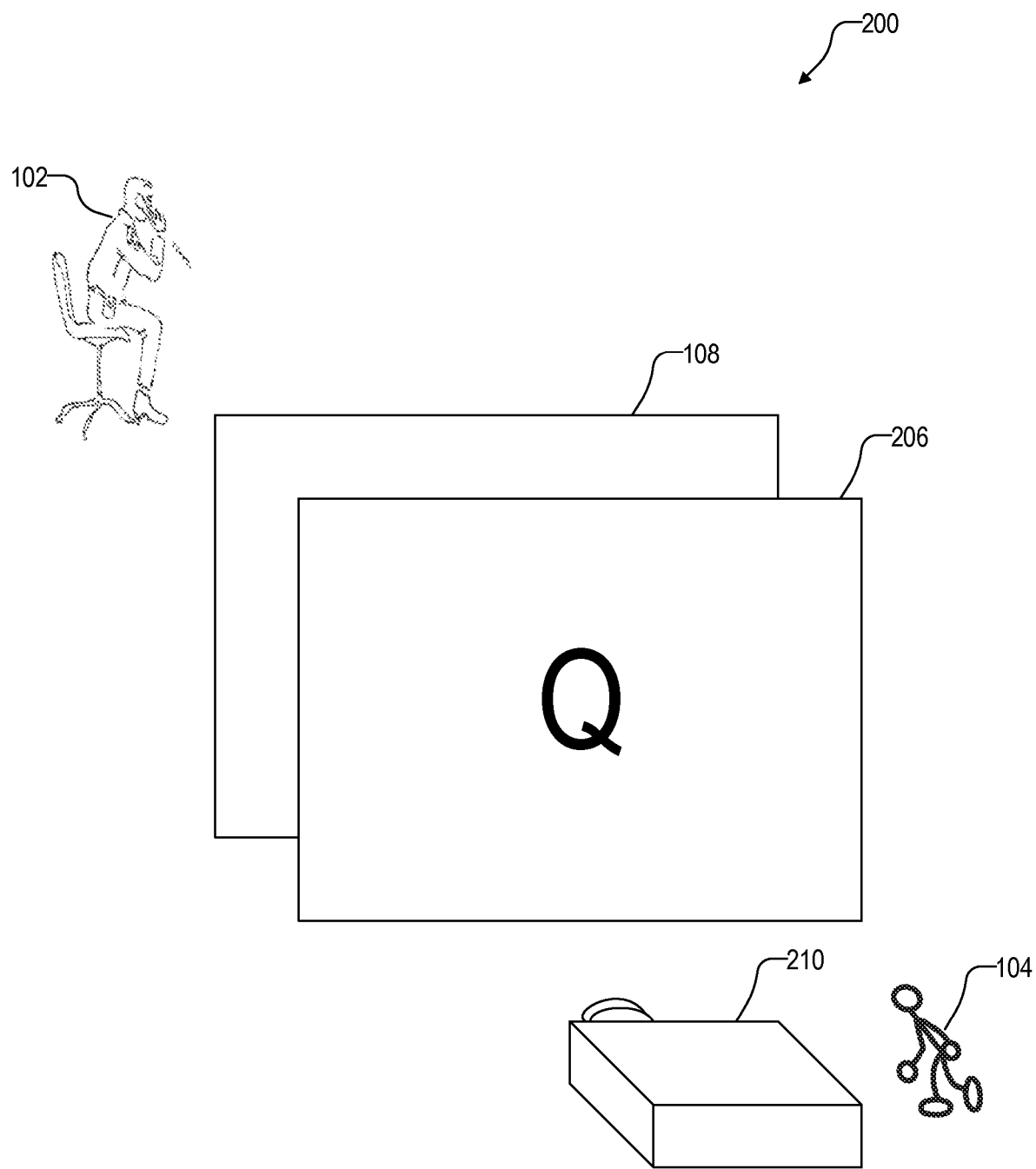
FIG. 2 illustrates a front-projection one-way display system in one embodiment of the invention.

FIG. 2 illustrates a front-projection one-way display system 200 in one embodiment of the invention. System 200 includes a transparent screen 206, transparent color filter 108, and a projector 210. System 200 operates similarly in principle as system 100.

Projector 210 emits one or more narrow bands of colors to form an image Q visible to viewer 104 from the front side of screen 206. For example, projector 210 emits narrow bands of red, green, and blue lights.

Color filter 108 removes the narrow bands emitted by projector 210. This prevents viewer 102 from seeing image Q on the backside of screen 206. As color filter 108 only removes narrow bands, person 102 still sees objects on the other side of screen 206 minus the narrow bands. Furthermore, person 104 sees image Q on the front side of screen 106. In one embodiment, screen 206 and color filter 108 are separate elements and color filter 108 is mounted on screen 206. Alternatively, screen 206 and color filter 108 are manufactured as an integral element.

Projector 210 may be a liquid crystal display (LCD) projector, a digital light processing (DLP) projector, a laser projector, a slide projector, or any device capable of emitting narrow bands of colors. In one embodiment, the narrow bands that are emitted by projector 210 are equal or narrower than the normal ranges of the wavelengths listed above. For example, the narrow bands can be made as small as possible with current projector and notch filter technologies.

Figure 3:
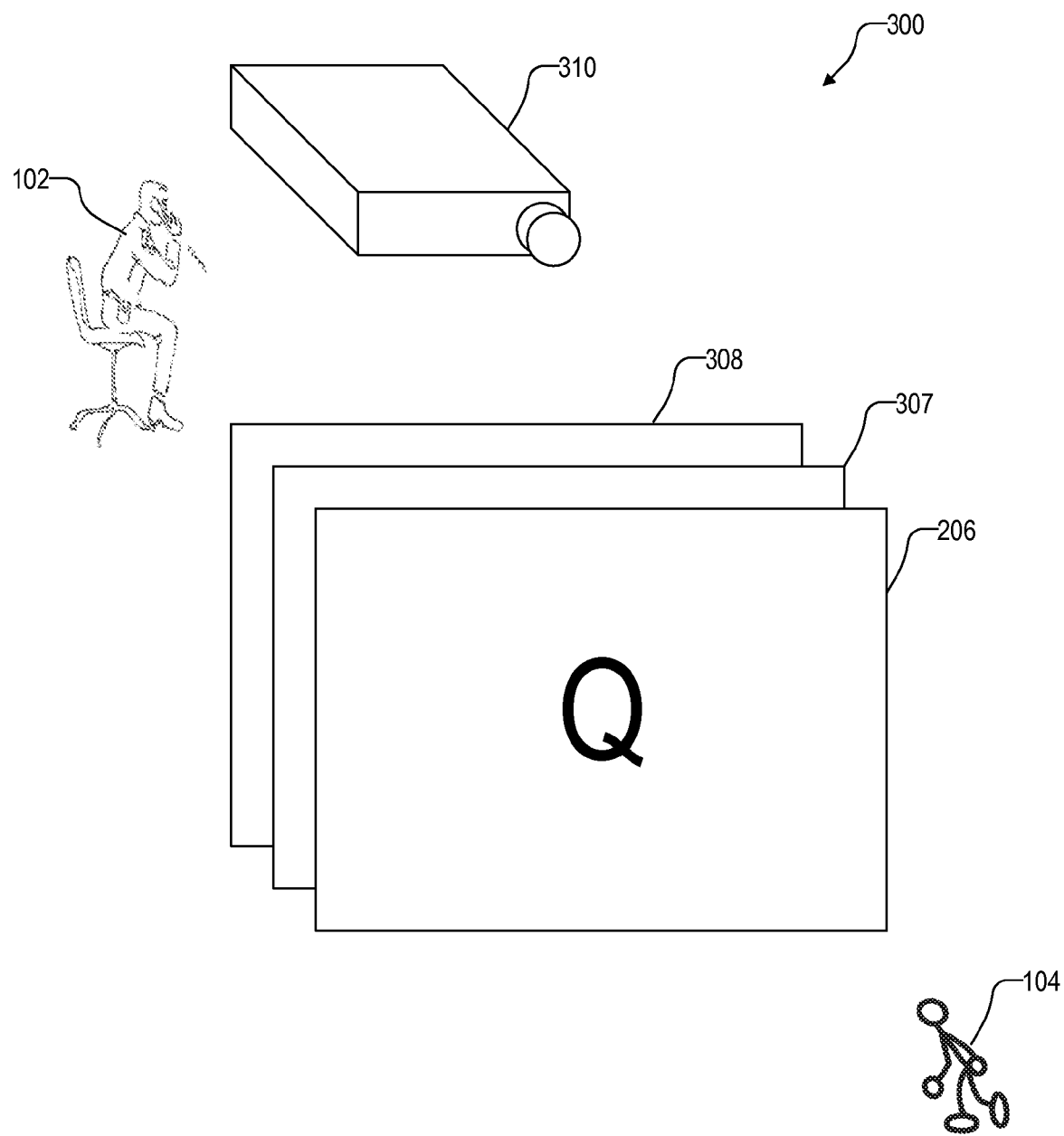
FIG. 3 illustrates a rear-projection one-way display system in one embodiment of the invention.

FIG. 3 illustrates a rear-projection one-way display system 300 in one embodiment of the invention. System 300 includes transparent screen 206, a transparent precision wavelength changing layer 307, a transparent color filter 308, and a projector 310. In one embodiment, screen 206, wavelength changing layer 307, and color filter 308 are separate elements where color filter 308 is mounted to wavelength changing layer 307, and wavelength changing layer 307 is mounted to screen 206. In one embodiment, wavelength changing layer 307 and screen 206 are implemented as a fluorescent screen that receives ultraviolet light and in response emits visible light, and color filter is mounted to the fluorescent screen. In yet another embodiment, screen 206, wavelength changing layer 307, and color filter 308 are manufactured as an integral element.

Projector 310 emits one or more narrow bands of light to form an image Q visible to viewer 104 from the front side of screen 206. In one embodiment, projector 310 emits narrow bands of ultraviolet light. In another embodiment, projector 310 emits visible lights (e.g., red, green, and blue lights). Unlike system 200, color filter 308 does not remove the narrow bands emitted by projector 310 in their initial pass through color filter 308. Instead, color filter 308 only removes narrow bands having frequencies that are slightly different from those emitted by projector 310.

After passing through color filter 308, the narrow bands pass through wavelength changing layer 307. In response to the narrow bands, wavelength changing layer 307 emits new narrow bands that have frequencies that are slight different (e.g., shifted) from the original narrow bands. Wavelength changing layer 307 otherwise does not affect the other wavelengths. If the narrow bands are color lights, the shift may be small enough so the new narrow bands remain in the wavelengths of the colors of the original narrow bands (i.e., they still appear red, green, and blue to a human observer). The new narrow bands then strike screen 206 to generate an image Q that is visible to person 104 from the front side of screen 206.

Some of the new narrow bands may diffuse, reflect, or otherwise travel back through wavelength changing layer 307 and onto color filter 308. Color filter 308 now substantially removes the new narrow bands and prevents viewer 102 from seeing the image on the backside of screen 206. A narrow band is substantially removed when color filter 308 blocks (e.g., by reflecting, absorbing, or other similar methods) 50% or more of the energy in the band. Preferably, each narrow band is contained within a filtered band of color filter 308. After color filter 308 removes light in very narrow bands, person 102 still sees objects on the other side of screen 206 minus the colors of the narrow bands.

Color filter 308 may be implemented like filter 108, and projector 310 may be implemented like projector 210. In one embodiment, the narrow bands that are emitted by projector 310 are equal to or narrower than the normal range of the wavelengths listed above. For example, the narrow bands can be made as small as possible with current projector and notch filter technologies.

Various other adaptations and combinations of features of the embodiments disclosed are within the scope of the invention. Numerous embodiments are encompassed by the following claims.

What is claimed is:

1. A display system, comprising:
   a transparent screen providing an image comprising light of at least a first band of wavelengths; and
   a transparent color filter located on a first side of the transparent screen, the transparent color filter removing light of at least a second band of wavelengths so the image is only visible from a second side of the transparent screen.

2. The system of claim 1, wherein the first and the second bands of wavelengths substantially overlap.

3. The system of claim 2, wherein the first and the second bands of wavelengths substantially overlap when the transparent color filter blocks at least 50% of energy of light in the first band.

4. The system of claim 2, wherein the first and the second bands of wavelengths are equal to or narrower than all wavelengths perceived to be of a same color.

5. The system of claim 2, wherein the transparent screen comprises transparent light emitting diodes ("LEDs") emitting the first band of wavelengths.

6. The system of claim 2, wherein:
   the transparent screen comprises transparent LEDs emitting multiple bands of wavelengths, the bands of wavelengths being from multiple colors, the bands of wavelength forming the image in color; and
   the transparent color filter removing the bands of wavelengths.

7. The system of claim 2, further comprising:
   a projector located on the second side of the transparent screen, the projector emitting the first band of wavelengths toward the transparent screen to form the image.

8. The system of claim 2, further comprising:
   a projector located on the second side of the transparent screen, the projector emitting multiple bands of wavelengths toward the transparent screen to form the image, the bands of wavelengths being from multiple colors, the bands of wavelengths forming the image in color;
   wherein the transparent color filter removes the bands of wavelengths.

9. The system of claim 2, wherein the transparent screen and the transparent color filter are selected from the group consisting of (1) the transparent screen and the transparent color filter are separate elements mounted together, and (2) the transparent screen and the transparent color filter are an integral element.

10. The system of claim 1, wherein the first and the second bands of wavelengths do not substantially overlap.

11. The system of claim 10, wherein the first and the second bands of wavelengths do not substantially overlap when the transparent color filter blocks less than 50% of energy of light in the first band.

12. The system of claim 10, further comprising:
a projector located on the first side of the transparent screen, the projector emitting the first band of wavelengths toward the transparent screen; and
a transparent wavelength changing layer located between the transparent color filter and the transparent screen, the wavelength changing layer receiving the first band of wavelengths and in response emitting the second band of wavelengths.

13. The system of claim 12, wherein the transparent screen, the transparent color filter, and the transparent wavelength changing layer are selected from the group consisting of (1) at least two of the transparent screen, the transparent color filter, and the transparent wavelength changing layer are separate elements mounted together, and (2) the transparent screen, the transparent color filter, and the transparent wavelength changing layer are an integral element.

14. The system of claim 10, further comprising:
a projector located on the first side of the transparent screen, the projector emitting a first plurality of bands of wavelengths toward the transparent screen, the first plurality of bands of wavelengths being from multiple colors;
a transparent wavelength changing layer located between the transparent color filter and the transparent screen, the wavelength changing layer receiving the first plurality of bands of wavelengths and in response emitting a second plurality of bands of wavelengths, wherein:
the second plurality of bands of wavelengths forming the image in color on the transparent screen; and
the transparent color filter removes the second plurality of bands of wavelengths.

15. A method for providing a one-way display, comprising:
providing an image on a transparent screen with light of at least a first band of wavelengths; and
filtering, with a transparent color filter, at least a second band of wavelengths from a first side of the transparent screen so the image is only visible from a second side of the transparent screen.

16. The method of claim 15, wherein the first and the second bands of wavelengths substantially overlap.

17. The method of claim 16, wherein the first and the second bands of wavelengths substantially overlap when the transparent color filter blocks at least 50% of energy of light in the band.

18. The method of claim 16, wherein the first and the second bands of wavelengths are equal to or narrower than all wavelengths perceived to be of a same color.

19. The method of claim 16, wherein said providing comprises using transparent light emitting diodes ("LEDs") in the transparent screen to emit the first band of wavelengths.

20. The method of claim 16, wherein:
said providing comprises using transparent LEDs in the transparent screen to emit multiple bands of wavelengths, the bands of wavelengths being from multiple colors, the bands of wavelengths forming the image in color; and
said filtering comprises filtering the bands of wavelengths.

21. The method of claim 16, wherein:
said providing comprises using a projector to emit the first band of wavelengths toward the transparent screen to form the image.

22. The method of claim 16, wherein:
said providing comprises using a projector to emit multiple bands of wavelengths toward the transparent screen, the bands of wavelengths being from multiple colors, the bands of wavelengths forming the image in color; and
said filtering comprises filtering the bands of wavelengths.

23. The method of claim 15, wherein the first and the second bands of wavelengths do not substantially overlap.

24. The method of claim 23, wherein the first and the second bands of wavelengths do not substantially overlap when the transparent color filter blocks less than 50% of energy of light in the band.

25. The method of claim 23, wherein:
said providing comprises using a projector to emit the first band of wavelengths toward the transparent screen; and
the method further comprises receiving the first band of wavelengths and in response emitting the second band of wavelengths.

26. The system of claim 23, wherein:
said providing comprises using a projector to emit a first plurality of bands of wavelengths toward the transparent screen, the first plurality of bands of wavelengths being from multiple colors;
the method further comprises receiving the first plurality of bands of wavelengths and in response emitting a second plurality of bands of wavelengths, wherein the second plurality of bands of wavelengths forms the image in color; and
said filtering comprises filtering the second plurality of bands of wavelengths.

* * * * *